(12) United States Patent
Ogino et al.

(10) Patent No.: US 8,429,573 B2
(45) Date of Patent: Apr. 23, 2013

(54) DATA GENERATION METHOD FOR SEMICONDUCTOR DEVICE, AND ELECTRON BEAM EXPOSURE SYSTEM

(75) Inventors: Kozo Ogino, Kawasaki (JP); Hiromi Hoshino, Kawasaki (JP)

(73) Assignee: Fujitsu Semiconductor Limited, Yokohama-shi (JP)

( * ) Notice: Subject to any disclaimer, the term of this patent is extended or adjusted under 35 U.S.C. 154(b) by 414 days.

(21) Appl. No.: 12/350,525

(22) Filed: Jan. 8, 2009

(65) Prior Publication Data
US 2009/0187878 A1     Jul. 23, 2009

(30) Foreign Application Priority Data

Jan. 18, 2008  (JP) ................................. 2008-008709

(51) Int. Cl.
G06F 17/50    (2006.01)
G03F 1/00     (2006.01)
G03F 7/20     (2006.01)

(52) U.S. Cl.
USPC ................... 716/54; 716/50; 716/51; 716/52; 716/53; 716/55; 716/56; 430/5; 430/196

(58) Field of Classification Search .............. 716/50–55; 430/5, 296
See application file for complete search history.

(56) References Cited

U.S. PATENT DOCUMENTS

| 4,954,717 | A | * | 9/1990 | Sakamoto et al. | ......... 250/492.3 |
| 6,083,410 | A | * | 7/2000 | Ikegawa et al. | ................ 216/22 |
| 6,157,047 | A | * | 12/2000 | Fujita et al. | ..................... 257/51 |
| 6,235,450 | B1 | | 5/2001 | Nakasuji | |
| 6,316,163 | B1 | * | 11/2001 | Magoshi et al. | ............... 430/296 |
| 6,370,441 | B1 | * | 4/2002 | Ohnuma | ....................... 700/121 |
| 6,453,274 | B2 | * | 9/2002 | Kamon | ......................... 703/2 |
| 6,519,758 | B2 | * | 2/2003 | Miyagawa | ...................... 716/52 |
| 7,043,327 | B2 | * | 5/2006 | Tsai et al. | ..................... 700/121 |
| 7,332,252 | B2 | * | 2/2008 | Kang et al. | ......................... 430/5 |
| 7,382,447 | B2 | * | 6/2008 | Mieher et al. | ................. 356/125 |

(Continued)

FOREIGN PATENT DOCUMENTS

JP          06188179 A    *   7/1994
JP          2003-151885       5/2003

OTHER PUBLICATIONS

Y. Gotoh et al., "Pattern dependent alignment technique for mix-and-match electron-beam lithography with optical lithography"; J. Vac. Sci. Technol. B 16 (1998) pp. 3202-3205.
German Office Action for corresponding German Application 10 2009 004 392.6-54; dated Aug. 24, 2010.

*Primary Examiner* — Helen Rossoshek
(74) *Attorney, Agent, or Firm* — Staas & Halsey LLP

(57)        ABSTRACT

A method includes: generating electron beam exposure data, used for electron beam exposure, from design data of a semiconductor device; extracting differential information indicating a difference in shape between an electron beam exposure pattern formed on a substrate through electron beam exposure on the basis of the electron beam exposure data and a photoexposure pattern formed on the substrate through photoexposure on the basis of the design data of the semiconductor device; determining whether the size of the difference in shape between the electron beam exposure pattern and the photoexposure pattern falls within a predetermined reference value; acquiring shape changed exposure data by changing the shape of the pattern of the electron beam exposure data in accordance with the differential information and updating the electron beam exposure data; and repeating the differential extraction, the determination and the updating when the size of the difference falls outside the predetermined reference value.

8 Claims, 16 Drawing Sheets

U.S. PATENT DOCUMENTS

| | | | |
|---|---|---|---|
| 7,384,710 B2 * | 6/2008 | Ogawa et al. | 430/5 |
| 7,569,842 B2 * | 8/2009 | Takita | 250/492.22 |
| 8,136,057 B2 * | 3/2012 | Hoshino | 716/53 |
| 8,298,732 B2 * | 10/2012 | Minemura et al. | 430/30 |
| 2003/0211751 A1 | 11/2003 | Lin | |
| 2007/0026320 A1 * | 2/2007 | Dai et al. | 430/5 |
| 2008/0050676 A1 * | 2/2008 | Hoshino | 430/296 |
| 2008/0138986 A1 * | 6/2008 | Zhou et al. | 438/690 |
| 2009/0123853 A1 * | 5/2009 | Arai | 430/5 |

* cited by examiner

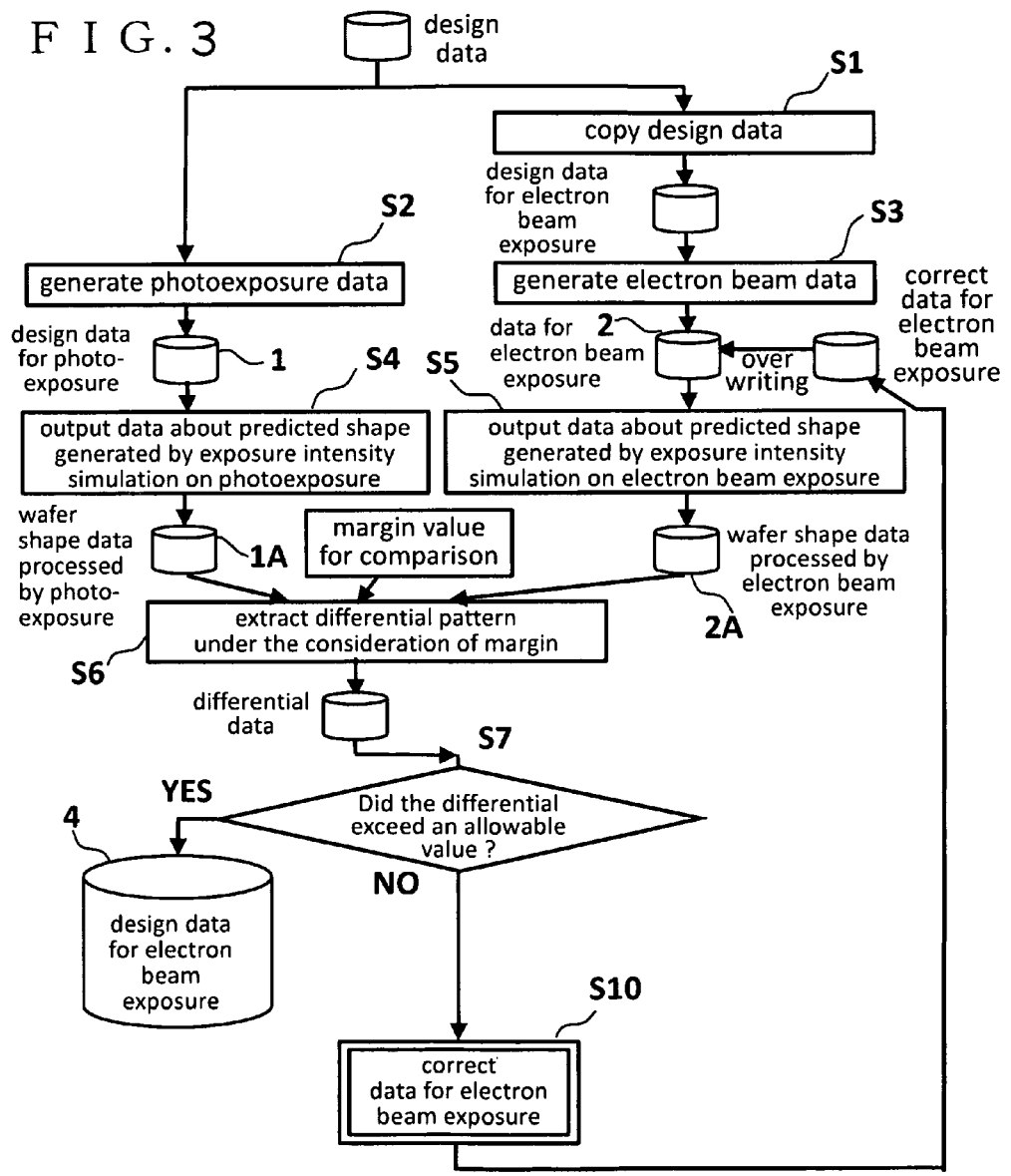

FIG. 6

| | differential flag(+/-) | | |
| --- | --- | --- | --- |
| | vertex(n) | | |
| 1 | vertex x coordinate x1 | vertex y coordinate y1 | neighboring flag(0/1) |
| 2 | vertex x coordinate x2 | vertex y coordinate y2 | neighboring flag(0/1) |
| 3 | vertex x coordinate x3 | vertex y coordinate y3 | neighboring flag(0/1) |
| 4 | vertex x coordinate x4 | vertex y coordinate y4 | neighboring flag(0/1) |
| | ... | ... | ... |
| | ... | ... | ... |
| n-2 | vertex x coordinate $x_{(n-2)}$ | vertex y coordinate $y_{(n-2)}$ | neighboring flag(0/1) |
| n-1 | vertex x coordinate $x_{(n-1)}$ | vertex y coordinate $y_{(n-1)}$ | neighboring flag(0/1) |
| n | vertex x coordinate $x_{(n)}$ | vertex y coordinate $y_{(n)}$ | neighboring flag(0/1) |

FIG. 9

| | differential amount d1 | side movement amount s1 |
|---|---|---|
| 1 | differential amount d1 | side movement amount s1 |
| 2 | differential amount d2 | side movement amount s2 |
| 3 | differential amount d3 | side movement amount s3 |
| ⋮ | ⋮ | ⋮ |
| n-1 | differential amount d(n-1) | side movement amount s(n-1) |
| n | differential amount d(n) | side movement amount s(n) | differential correction table

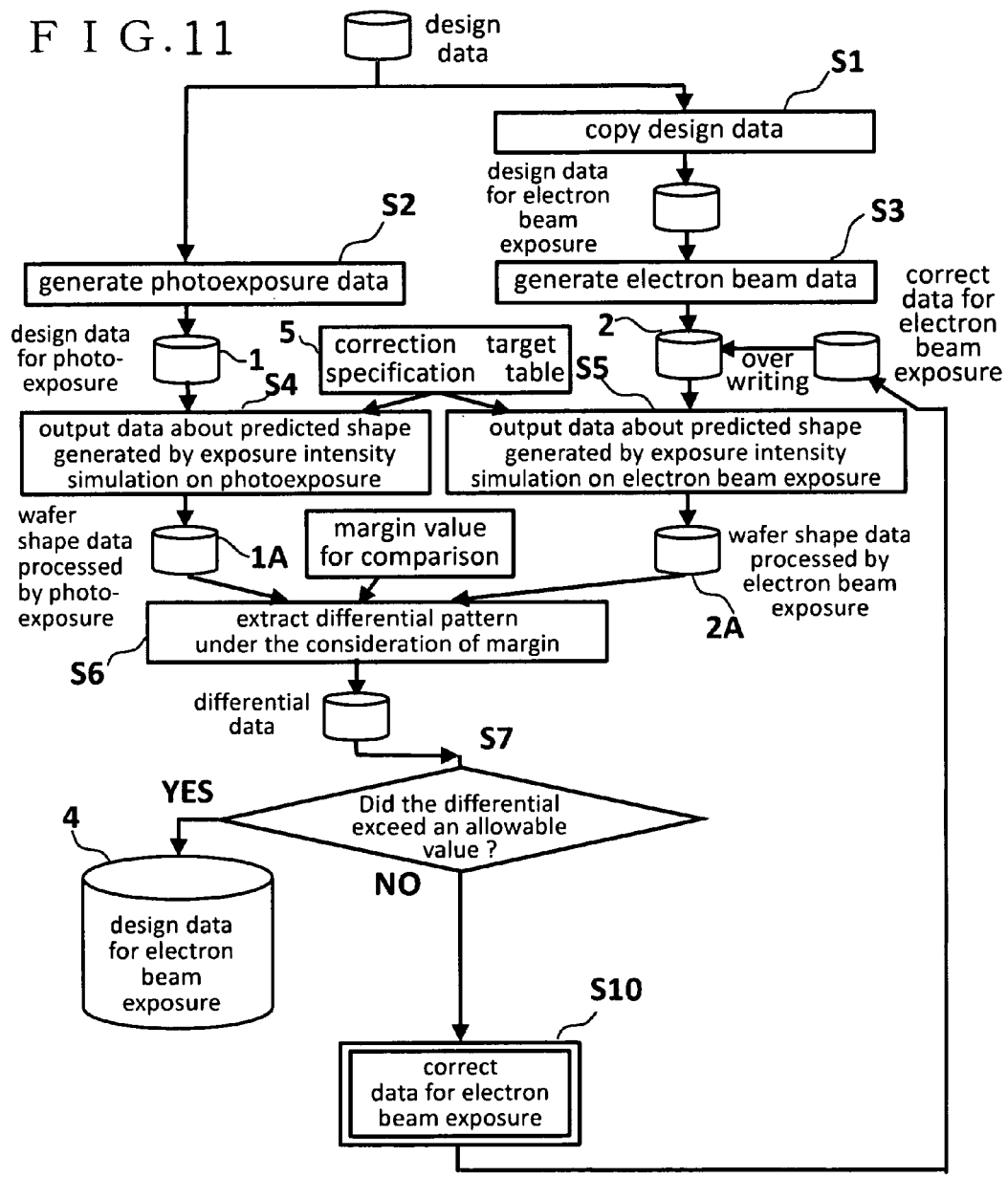

FIG. 13

| | bottom left X coordinate | bottom left Y coordinate | top right X coordinate | top right Y coordinate |
|---|---|---|---|---|
| region 1 | x11 | y11 | x12 | y12 |
| region 2 | x21 | y21 | x22 | y22 |
| region 3 | x31 | y31 | x32 | y32 |
| ⋮ | ⋮ | ⋮ | ⋮ | ⋮ |
| region m | xm1 | ym1 | xm2 | ym2 |

DATA GENERATION METHOD FOR SEMICONDUCTOR DEVICE, AND ELECTRON BEAM EXPOSURE SYSTEM

CROSS REFERENCE TO RELATED APPLICATION

This application is based upon and claims the benefit of priority from the prior Japanese Patent Application NO. 2008-8709 filed on Jan. 18, 2008, the entire contents of which are incorporated herein by reference.

BACKGROUND OF THE INVENTION

1. Field of the Invention

The embodiments discussed herein are related to a data generation technology for electron beam patterning.

2. Description of the Related Art

In a lithography process, a mass production process that produces a large amount of semiconductor devices generally employs a photoexposure technology. In recent years, however, miniaturization and highly-functional feature of semiconductor devices have increased the number of elements mounted on a single semiconductor device and, as a result, manufacturing a reticle that is necessary for manufacturing semiconductor devices is becoming more and more difficult. The increases in cost and time for manufacturing a reticle are big obstacles to success in semiconductor device business. Then, when a highly productive photoexposure technology is used for mass production and an electron beam exposure technology that does not require a costly reticle is used for small-volume production such as engineering sample (ES), a work load for manufacturing a reticle may be avoided.

However, when different exposure technologies are used, resultant shapes of resist patterns do not coincide with each other due to a difference in physical phenomenon. This requires a change in condition and/or parameter in processes following the lithography process and, in addition, there is a problem that semiconductor devices will have different characteristics, or the like. For this reason, even for small-volume products, a photoexposure technology that requires a manufactured reticle is often used for manufacturing semiconductor devices.

To address the above problem, it is conceivable that a design data library for electron beam exposure, in which a shape processed by electron beam exposure coincides with a shape processed by photoexposure, is prepared in advance, a piece of electron beam data corresponding to the input design data is selected from among the design data library for electron beam exposure and replaces the input design data with the corresponding electron beam data to thereby generate electron beam exposure data. However, if such a procedure is employed, the pattern shape of design data for electron beam exposure becomes complex and, therefore, work for generating exposure data may possibly increase. It is an object of the invention to provide a technology for generating electron beam exposure data by which an increase in work load for generating exposure data is suppressed and the shape processed by electron beam exposure is approximated to the shape processed by photoexposure with a less calculation load.

SUMMARY OF THE INVENTION

According to an aspect of the embodiments, a data generation method for a semiconductor device is provided.

The data generation method includes: an electron beam exposure data generation step of generating electron beam exposure data, used for electron beam exposure, from design data of the semiconductor device; a differential extraction step of extracting differential information that indicates a difference between the shape of an electron beam exposure pattern formed on a substrate through electron beam exposure on the basis of the electron beam exposure data and the shape of a photoexposure pattern formed on the substrate through photoexposure on the basis of the design data of the semiconductor device; a determination step of determining whether the size of the difference between the shape of the electron beam exposure pattern and the shape of the photoexposure pattern falls within a predetermined reference value; an updating step of acquiring shape changed exposure data by changing the shape of the pattern of the electron beam exposure data in accordance with the differential information to update the electron beam exposure data; and a controlling step of repeating the differential extraction step, the determination step and the updating step when the size of the difference falls outside the predetermined reference value.

The object and advents of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF THE DRAWINGS

FIG. 3 is a view that illustrates an electron beam exposure data generation flow according to a first embodiment.

FIG. 6 is a view that illustrates the data structure of a differential pattern storage table that stores a differential pattern.

FIG. 9 is a data example of a differential correction table.

FIG. 11 is a view that illustrates the process flow in which electron beam exposure data are corrected with a limited correction target.

FIG. 13 is a data example of a correction target specification table.

DESCRIPTION OF THE PREFERRED EMBODIMENTS

Hereinafter, a data generation device according to a preferred embodiment (hereinafter, referred to as embodiment) of the invention will be described with reference to the accompanying drawings. The configurations of the following embodiments are illustrative, and the aspects of the invention are not limited to the configurations of the embodiments.

Outline of Process

The data generation device generates electron beam exposure data that are used when a pattern on the substrate of a semiconductor device is processed. However, the data generation device generates the electron beam exposure data by which the shape of a pattern processed by electron beam exposure is approximated to the shape of a pattern processed by photoexposure.

First Method (Prior Art)

Figure 1:
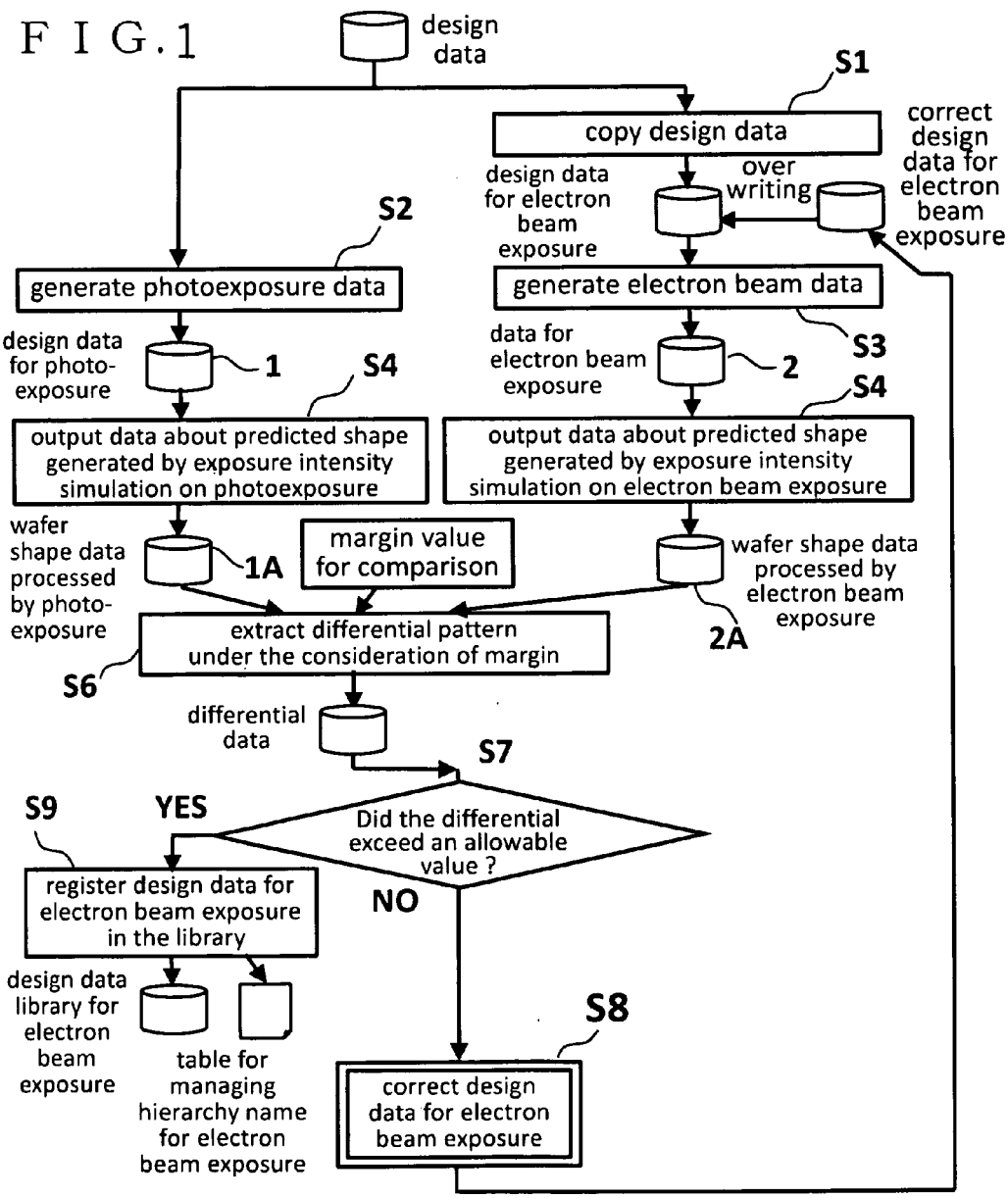
FIG. 1 is a view that schematically illustrates a first method for generating electron beam exposure data.

FIG. 1 schematically shows a first method for generating such electron beam exposure data. Here, the design data are processed so that the shape of a pattern processed by electron beam exposure is approximated to the shape of a pattern processed by photoexposure. Thus, the data generation device first copies the design data of the semiconductor device to create a design data library file for electron beam exposure (S1). The design data include cell library data, wiring data for wiring layers, and via hole data.

The cell library data are, for example, a set of polygonal patterns that constitute elements, such as transistors. The wiring data are also mostly defined as a polygonal pattern. In addition, the via hole data are, for example, patterns defined as a rectangle. These cell library data, wiring data, and via hole data are respectively assigned with identification information called hierarchy name or wiring information. The identification information is also called cell name.

The hierarchy name or wiring information is defined uniquely in a data file that constitutes the design data. Thus, it is possible to arrange a pattern by referring to the hierarchy name or wiring information. In addition, a new component may be defined by referring to the hierarchy name or wiring information. The layout pattern of the semiconductor device may be configured through a combination of those components.

In the present embodiment, when copying, the prefix "E" is added to these hierarchy names to allow the obtained data to be distinguished from the original data and to be correspondent with the original data.

Next, the data generation device executes two types of exposure data generation process on an exposure target layer in the design data. One process is to input the design data to generate photoexposure data (S2). This process is, for example, the same as the exposure data generation process for manufacturing a reticle. Through the above process, the photoexposure data are stored in a photoexposure data storage unit 1 of the data generation device.

The other process is to replace portion of the design data with electron beam exposure design data to generate electron beam exposure data (S3). Through the above process, the electron beam exposure data are stored in an electron beam exposure data storage unit 2 of the data generation device.

In the processes of S2 and S3, the data generation device executes a dummy pattern generation for planarization on an exposure layer that needs the dummy pattern generation. Furthermore, the data generation device, in the photoexposure data generation process in S2, executes data processing necessary for generating exposure data for manufacturing a reticle, such as an optical proximity correction, a local flare correction, or a microloading effect correction for considering the influence of etching.

In addition, the data generation device, in the process of generating the electron beam exposure data in S3, executes a proximity correction, a stitching correction, a microloading effect correction for considering the influence of etching, or the like.

Next, the data generation device uses exposure intensity simulations by photoexposure and by electron beam exposure on the respectively generated pieces of exposure data, and then outputs the respective shapes on the semiconductor substrate as pattern data (S4 and S5).

As a result of the process in S4, wafer shape data 1A processed by photoexposure are generated. The wafer shape data 1A processed by photoexposure are data that simulate the shape formed through photoexposure. In the photoexposure, a reticle is created from the photoexposure data, and when the pattern on the reticle is transferred onto the semiconductor substrate using light, a pattern is formed in a resist applied on the semiconductor substrate. A storage unit that stores the wafer shape data 1A processed by photoexposure corresponds to a photoexposure pattern storage unit according to the aspects of the invention. The storage unit is, for example, formed on a hard disk.

In addition, as a result of the process in S5, wafer shape data 2A processed by electron beam exposure are generated. A storage unit that stores the wafer shape data 2A processed by electron beam exposure corresponds to an electron beam exposure pattern storage unit according to the aspects of the invention. The wafer shape data 2A processed by electron beam exposure are data that simulate the shape formed through electron beam exposure. In the electron beam exposure, when an electron beam is irradiated onto the semiconductor substrate in accordance with the electron beam exposure data, a pattern is formed in a resist applied on the semiconductor substrate. The storage unit is, for example, formed on a hard disk as well.

Here, a light intensity simulator is used for the photoexposure data. The data generation device evaluates the Fourier integral of a calculation model formula (Yeung's model) of an optical image based on the theory of partial coherent image formation with respect to a focal length on a pupil plane and a complex amplitude transmittance distribution, and then squares the evaluated value to thereby acquire the optical image on the semiconductor substrate. Furthermore, the data generation device calculates a light intensity distribution on the semiconductor substrate from an in-resist intensity distribution (Mack's model) taking into consideration reflections on a resist film and a base substrate. Then, the data generation device calculates a resist shape, which is exposed and developed, by drawing contours of the light intensity distribution. The processing of the light intensity simulator is well known and, hence, the details thereof are omitted.

Further, the data generation device calculates an absorption energy distribution through simulation with the electron beam exposure simulator for the electron beam exposure data. Then, the data generation device outputs the shape data on the semiconductor substrate, for which the contours of the absorption energy intensity are patterned. Here, the data generation device calculates the loci of incident electrons within a sample by the Monte Carlo method, scattering angles of the electrons by the Screened Rutherford scattering formula and an energy loss by the Bethe's stopping power formula. Moreover, the data generation device obtains, as a function of position, the absorption energy distribution per unit area in the resist. Then, the data generation device converts the absorption energy distribution into a solution rate distribution with respect to a developing solution to finally calculate the resist shape that is exposed and developed. The electron beam exposure simulator is well known and, hence, the details thereof are omitted.

Then, the data generation device compares the respective pieces of shape data with each other to thereby extract a differential pattern (S6). A comparing method may perform SUB operation in the graphical operation between the shape data processed by photoexposure and the shape data processed by electron beam exposure.

Note that, in the above description, the same process as the exposure data generation process for manufacturing a reticle is executed in the process in S2. However, the process in S2 is not limited to the exposure data generation process for manufacturing a reticle. It is only necessary that the process converts the design data into data in an interface format, which are imputable to the photoexposure simulator. Further, the process of generating the electron beam exposure data is executed as the process in S3. However, the process in S3 is not limited to the electron beam exposure data generation process. It is only necessary that the process converts the design data into data in an interface format, which are imputable to the electron beam exposure simulator.

Next, the data generation device determines whether the differential exceeds an allowable value (S7). That is, the data generation device holds the allowable value (margin value) as to whether it is determined to be the differential, and, if the differential exceeds the allowable value, determines that there is a differential. A value that represents a range in which a shape difference of the resist pattern falls within allowable process variations and a value that represents a range that does not influence a characteristic difference are externally specified as the allowable value. It may be enough that an empirical value obtained by the actual semiconductor process or an experimental value can be set as the allowable value.

As a result of the comparison, if no differential is recognized (YES in S7), the data generation device registers a design data library file for electron beam exposure in the design data library for electron beam exposure, and creates an electron beam exposure hierarchy name/wiring information management table for which the hierarchy name is extracted from within the design data for electron beam exposure (S9). In this case, the differential data will not be used. The electron beam exposure hierarchy name/wiring information management table has three elements specified by hierarchy name/wiring information, an address, and a data size. The hierarchy name/wiring information is an unique name within the design data for identifying a hierarchy or wiring information. The address is an address in a file that stores the design data. The data size is a data size of the pattern data that define the pattern of a layer or wiring. Accordingly, the data generation device, when the hierarchy name is given, accesses the electron beam exposure hierarchy name/wiring information management table to thereby make it possible to acquire a head address and data size of the pattern data defining the pattern associated with the hierarchy name and to read the corresponding pattern.

As described above, the design data library for electron beam exposure is managed in the same way on the condition that the design data library is, for example, corrected and managed by technology nodes or by performance characteristics of the devices. That is, it is only necessary that the design data library for electron beam exposure is prepared separately for each technology node or for each performance characteristic of the device.

If the differential is recognized (NO in S7), the data generation device corrects the design data for electron beam exposure in accordance with the differential data (S8).

Moreover, the data generation device updates the design data for electron beam exposure with the corrected design data, and generates the electron beam exposure data using the updated design data again. Then, the data generation device repeats the processes in S3 and S5 to S8 until the differential is eliminated.

Second Method

In the first method, the design data for electron beam exposure are updated using the differential data between the wafer shape data 1A processed by photoexposure and the wafer shape data 2A processed by electron beam exposure. That is, the design data will be updated using the differential data. As a result, the electron beam exposure data generation process (process in S3) will be executed again.

However, the pattern shape of the design data updated with the differential data is more complex than the original design data. Thus, the electron beam exposure data 2 generated from the updated design data tend to have a large data size. In addition, a load on a computer that executes the electron beam exposure data generation process (process in S3) is likely to be heavy.

Then, in the second method, the electron beam exposure data 2 are directly corrected using the differential data between the wafer shape data 1A processed by photoexposure and the wafer shape data 2A processed by electron beam exposure. In this case, only portion of the electron beam exposure data 2, neighboring the differential data, will be a correction target.

In addition, because the electron beam exposure data are directly corrected, it is not necessary to execute various types of correction for electron beam exposure again, that is, for example, various correction processes required for electron beam exposure, including a dose correction process, on the wafer. That is, because various types of correction process are executed before the pattern is corrected to a complex shape, a load on these correction processes is reduced as compared with the above first method.

However, according to the second method, because the dose correction process for the electron beam exposure data is not executed again, a variation in distribution of the dose before and after the correction needs to be reduced as much as possible. As a distribution in dose varies, the influence of back scattering in which an electron beam that enters the resist is reflected on the substrate and spreads to within the range of a radius of several tens of micrometers varies. As a result, a resultant dimension of the surrounding pattern varies. This requires corrections on the surrounding pattern as well, and increases data processing time. Then, in the data generation device, the corrected dose that is set in the dose correction process is fixed and only the shape is changed. A target shape is originally the same between electron beam exposure and photoexposure, so that even when the shape of the electron beam exposure pattern is changed so as to conform to the resultant shape formed by photoexposure, the area of the pattern does not fluctuate largely. However, by changing the shape so as to reduce fluctuations in area as small as possible, it is possible to reduce the side effect on the surroundings.

That is, the second method reduces the influence on a distribution in dose and partially corrects the electron beam exposure data so that the shape of the pattern after electron beam exposure is approximated to that of photoexposure to a maximum without executing the dose correction process on the electron beam exposure data again. By so doing, a load on the computer is reduced while the first correction result for the electron beam exposure data is effectively maintained, and electron beam exposure is implemented in the shape of the pattern approximate to that of photoexposure.

First Embodiment

Figure 2:
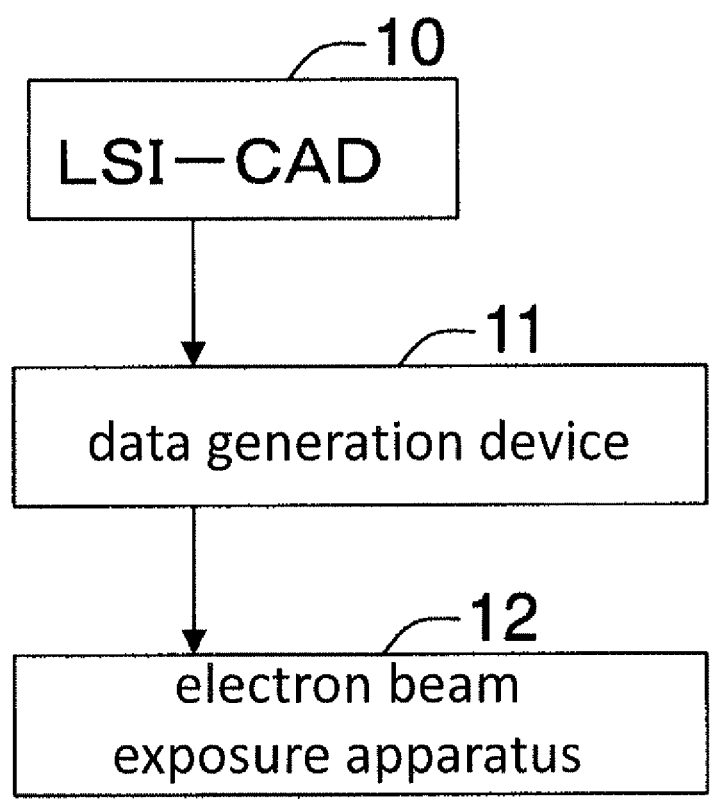
FIG. 2 is a view that illustrates the system configuration of an exposure system.

Hereinafter, an embodiment of the second method will be described with reference to the accompanying drawings
Hardware Configuration FIG. 2 is a view that illustrates the system configuration of the exposure system. As shown in FIG. 2, the exposure system includes a data generation device 11 and an electron beam exposure apparatus 12. The data generation device 11 generates electron beam exposure data from data of an electronic device, which are generated in an LSI-CAD 10. The electron beam exposure apparatus 12 performs electron beam exposure in accordance with the generated electron beam exposure data.

The data generation device is implemented in such a manner that a data generation program is executed on a typical computer such as a personal computer or a server. The computers of this type each have a CPU, a memory, an input/output interface, a display device, a hard disk, a communication interface with a network, a drive for a detachable portable storage medium, and the like. Components and operations of such computers are widely known, and, hence, description thereof is omitted.

The design data of the semiconductor device, which is processed by the data generation device, may be managed and stored on the same computer as that of the data generation device. Further, the data generation device may configure a computer system by linking with another computer. For example, there may be another computer that generates and manages the design data of the semiconductor device. It is only necessary that the data generation device can access the design data of the semiconductor device, which are managed by such another computer, via a network, for example. In addition, the data generation device may be installed to the electron beam exposure apparatus. For example, the data generation device may be a computer that is integrated with a control computer that controls the electron beam exposure apparatus.
Various Correction Processes The data generation device obtains the shapes of the resist patterns through photoexposure simulation and electron beam exposure simulation. In this case, various types of correction that are currently generally performed are executed on a reticle pattern used in the photoexposure simulation. These corrections are, specifically, executed on the electron beam exposure data for manufacturing a reticle. These corrections include a dummy pattern generation for planarization, an optical proximity correction, a local flare correction, a microloading effect correction for considering the influence of etching. Note that when the photoexposure pattern is calculated not through simulation but from the an SEM image, the above corrections will be similarly executed on the photoexposure data for manufacturing a reticle used for photoexposure.

Further, various types of correction that are currently generally performed are executed on the electron beam exposure data used in the electron beam exposure simulation. These corrections include the dummy pattern generation for planarization, a proximity correction, a stitching correction, the microloading effect correction for etching, and the like. Note that when the electron beam exposure pattern is calculated not through simulation but from the an SEM image, the above corrections will be similarly executed on the electron beam exposure data used for electron beam exposure.

Hereinafter, outlines of these corrections will be described. Note that these corrections are executed in accordance with a design rule that conforms to a technology, that is, in accordance with a minimum line width, a minimum pattern interval and a pattern density that are specified for every technology. Hence, the corrected design data may be managed by technologies.

(1) Dummy Pattern Generation for Planarization

The dummy pattern generation for the planarization is a process of equalizing the density of a pattern area for a gate layer and a metal layer (which is also called a wiring layer or a metal wiring layer). That is, a data area corresponding to the surface of the semiconductor substrate is divided into small areas each having a predetermined size, a pattern area in each small area of the input pattern is obtained, and then the density of an area of each small area is calculated. Then, a dummy pattern having a predefined configuration is added to a portion of small areas that do not reach a reference area density, having no influence of the dummy pattern in terms of operation of the element, among the small areas so as to reach the reference area density.

(2) Optical Proximity Correction (OPC)

The optical proximity correction (OPC) is a process of predicting an optical proximity effect (OPE) through simulation based on physical models of exposure and development, then calculating a mask pattern correction amount on the basis of the predicted value, and moving sides of the pattern on the data for manufacturing a reticle or changing the pattern shape. The above correction on the data reduces the occurrence of a phenomenon that the pattern shape formed on the semiconductor substrate deviates from the design shape. This phenomenon occurs, for example, due to formation of the pattern having a dimension that is approximately equal to or smaller than the wavelength of light used for exposure.

In the optical proximity correction, a rule-based OPC in which the design pattern is corrected on the basis of a correction rule (OPC rule) acquired beforehand and a model-based OPC in which the design pattern is corrected through simulation that models a phenomenon in the lithography process are selectively used depending on a target layer.

As a means of the rule-based OPC, first, a correction rule established by combining various types of graphic process is created experimentally, or the like. Specifically, this correction rule is a rule on a variation by which a line width is narrowed or widened on the basis of the line width or a neighboring space dimension for a pair of line patterns. The line correction is performed based on the above rule. A hammerhead correction in which a rectangular pattern is added to a tip end of the line pattern is performed in order to prevent the tip end of the line pattern from being transferred (patterned) in a narrow state. Moreover, a serif correction in which a rectangle is added to a protruded corner portion of the square pattern is performed in order to prevent the corner portion of the square pattern from being patterned in a recessed state. Further, an inset correction in which a recessed corner of an L-shaped pattern is cut out in order to prevent the recessed corner from being patterned in a swollen state.

The model-based OPC calculates a difference between the mask pattern and the transferred pattern formed on the semiconductor substrate through simulation on the basis of the original design data, and then moves sides of the pattern data to obtain the shape as is specified by the deign data.

(3) Local Flare Correction

In the local flare correction, an aperture ratio of the designed pattern is calculated for every constant area of a shot. Then, the amount of flare of the mask pattern corresponding to the transferred pattern is estimated with a point spread function that employs the double Gaussian function for every single shot area. Then, the dimension of a mask for obtaining a pattern having a predetermined dimension is calculated on the basis of the layout of shots to be transferred onto the semiconductor substrate, and then the sides of the pattern data are moved so as to obtain that dimension.

(4) Microloading Effect Correction

In the microloading effect correction, a phenomenon that an etching rate and an etching shape will change in accordance with the dimension of the pattern is experimentally obtained in advance. Then, a line width fluctuation (X) is set in a table containing a combination of the dimension of a pattern and a distance between adjacent patterns. The distance between the adjacent patterns is obtained for each of the sides of the pattern input to the data generation device, and the line width fluctuation (X) is obtained from the table that is experimentally set beforehand. Then, in the microloading effect correction, the position of a side is moved by −X/2 in an outward (neighboring pattern side) direction of the pattern with respect to the line width fluctuation (X). Here, the meaning of "−" (negative sign) represents that a movement is made in a direction opposite to the line width fluctuation (X) by the microloading effect.

(5) Proximity Correction

A proximity effect is a phenomenon that an exposure intensity distribution fluctuates in accordance with a pattern density, a pattern dimension and a pattern interval due to a scattered electron beam on the semiconductor substrate. The proximity correction sets an electron beam dose pattern by pattern and corrects a fluctuation in absorption energy of the resist due to the above phenomenon. That is, the dose for each exposure pattern is calculated on the basis of an exposure intensity distribution (EID) function that is experimentally obtained in advance. Then, a self alignment calculation is performed while changing the dose for each exposure pattern in order for each exposure pattern to eventually obtain the same absorption energy, and finally the dose for each pattern is acquired.

(6) Stitching Correction

For a pattern formed of shots that are stitched before and after moving the stage of the exposure apparatus, the stitching correction extends a pattern edge of the stitched portion or generates an additional pattern with the dose decreased approximately by half at a position at which the stitched portion is covered With the above correction, even when the stage is moved between the successive shots, the stitched portion is smoothed.

Process Flow

The process procedure of the present embodiment will be exemplified with reference to an electron beam exposure data generation flow shown in FIG. 3.

The data generation device inputs the design data of an exposure target layer of a semiconductor device and then executes two types of exposure data generation process. One process is a process to generate photoexposure data, that is, an exposure data generation process for manufacturing a reticle (S2, which corresponds to a photoexposure data generation step), and the other process is a process to generate electron beam exposure data (S3, which corresponds to an electron beam exposure data generation step). For an exposure layer that requires a dummy pattern generation for planarization, the dummy pattern generation is performed on the design data. Besides, in the exposure data generation process for manufacturing a reticle, data processing necessary for generating exposure data for manufacturing a reticle, such as a microloading effect correction for considering the influence of etching, an optical proximity correction, or a local flare correction, is performed. In the electron beam exposure data generation process, data processing necessary for wafer exposure, such as a microloading effect correction for considering the influence of etching, a proximity correction (including an dose correction), or a stitching correction, is performed. The data generation device of the present embodiment executes these exposure data generation processes once.

Exposure simulations are respectively performed on the respective pieces of the generated exposure data, and resist pattern shapes are output in form of pattern data (S4, which corresponds to a photoexposure simulation step) (S5, which corresponds to an electron beam exposure simulation step). A light intensity simulator is used for the photoexposure data, and an electron beam exposure simulator is used for the electron beam exposure data. Wafer shape data that contain the patterned contours of the exposure intensity distribution obtained through simulation are output.

Figure 4A:
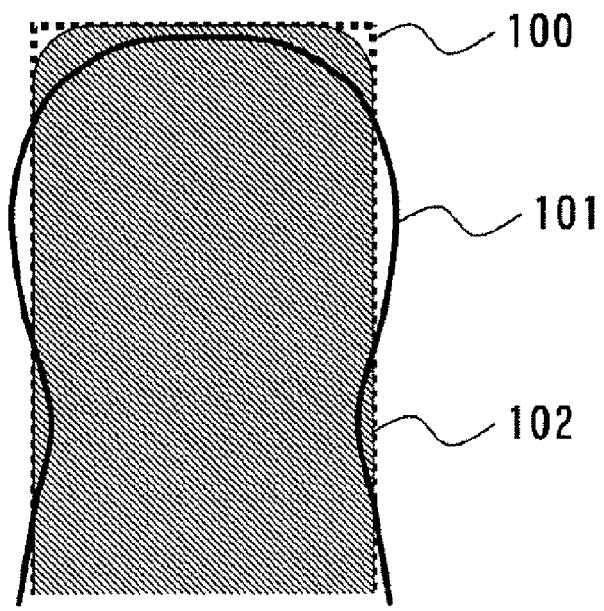
FIG. 4A is examples of patterns obtained through design data, a light intensity simulator, and an electron beam exposure simulator.

FIG. 4A shows examples of patterns obtained through the design data, the light intensity simulator, and the electron beam exposure simulator. In FIG. 4A, a pattern 100 indicated by dotted line shows a pattern having the same dimensions and the same shape as the design data for comparison. Further, a pattern 101 indicated by a solid line shows a resist shape on the semiconductor substrate that is calculated through the light intensity simulator. Moreover, a pattern 102 hatched with oblique lines shows a resist shape on the semiconductor substrate, which is calculated through the electron beam exposure simulator.

Next, the respective pieces of shape data are compared with each other to thereby obtain a differential (S6, which corresponds to a differential extraction step). The plus (+) differential pattern results from subtracting the shape data processed by electron beam exposure from the shape data processed by photoexposure in a graphical operation, and the minus (−) differential pattern results from subtracting the shape data processed by photoexposure from the shape data processed by electron beam exposure. The data generation device classifies the obtained differential data into the following plus (+) differential pattern and minus (−) differential pattern as described below. Specifically, the shape pattern processed by photoexposure and located outside the shape pattern processed by electron beam exposure is referred to as the plus (+) differential pattern. The plus (+) differential pattern may be obtained through SUB operation in such a manner that the shape data processed by electron beam exposure are subtracted from the shape data processed by photoexposure in the graphical operation.

Figure 4B:
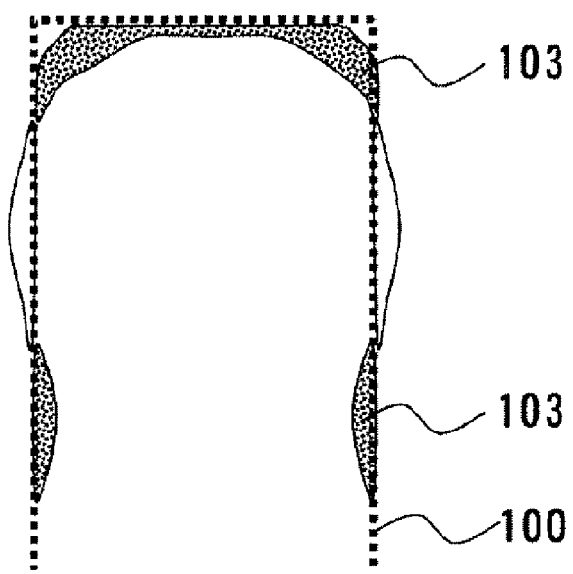
FIG. 4B is an example of a shape that is obtained through SUB operation by which the pattern formed by photoexposure is subtracted from the pattern formed by electron beam exposure.
Figure 4C:
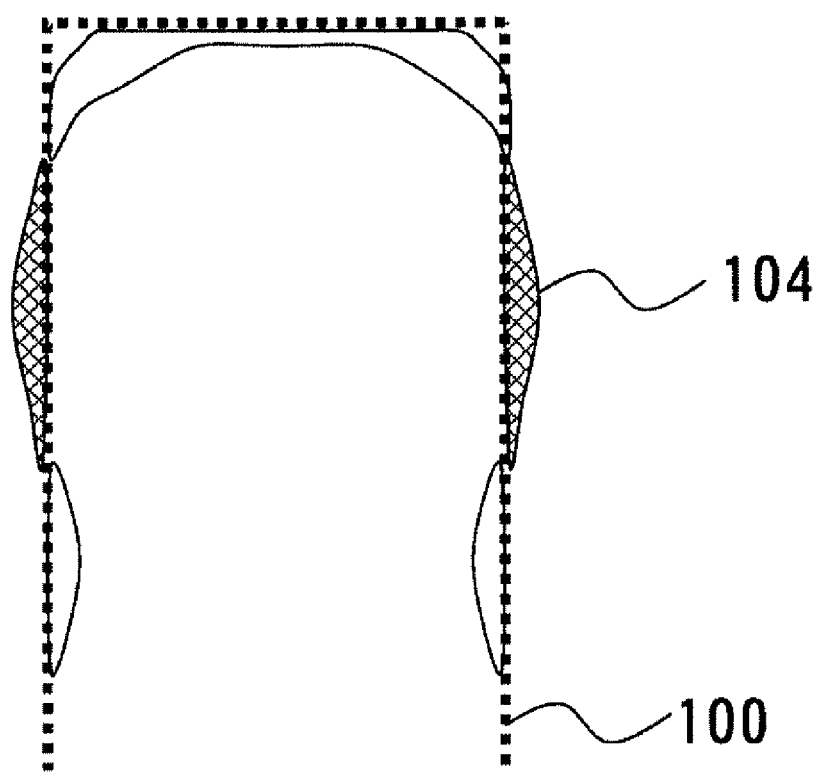
FIG. 4C is an example of a shape that is obtained through SUB operation by which the pattern formed by electron beam exposure is subtracted from the pattern formed by photoexposure.

A pattern 104 in FIG. 4C shows a shape obtained by performing SUB operation in which the pattern 102 processed by electron beam exposure is subtracted from the pattern 101 processed by photoexposure. FIG. 4C shows an example of the plus (+) differential pattern. The data generation device, for the plus (+) differential pattern, sets a flag for distinguishing a neighboring side that abuts on the pattern 102 processed by electron beam exposure in the pattern contour, and thus stores the differential data.

That is, the data generation device, when executing SUB operation in which the pattern 102 processed by electron beam exposure is subtracted from the pattern 101 processed by photoexposure, sets a flag on the neighboring side of the remaining pattern, abutting on the pattern 102 processed by electron beam exposure. Here, the neighboring side that abuts on the pattern 102 processed by electron beam exposure is a side neighboring the design data 100 as shown in FIG. 4C.

Accordingly, the flag is set so that the side on which the plus (+) differential pattern is neighboring the pattern of the shape change target data, that is, the design data for electron beam exposure that have not been corrected, may be identified. The flag is termed a neighboring flag.

Moreover, the shape pattern processed by electron beam exposure and located outside the shape pattern processed by photoexposure is referred to as the minus (−) differential pattern. The minus (−) differential pattern may be obtained through SUB operation in such a manner that the shape data processed by photoexposure are subtracted from the shape data processed by electron beam exposure in the graphical operation.

The pattern 103 in FIG. 4B shows a shape obtained through SUB operation in which the pattern 101 processed by photoexposure is subtracted from the pattern 102 processed by electron beam exposure. FIG. 4B shows an example of the minus (−) differential pattern. The data generation device, for the minus (−) differential pattern, distinguishes a side neighboring the shape pattern processed by photoexposure within the pattern contour, sets a flag on the non-neighboring side, and thus stores the differential data.

That is, the data generation device, when executing SUB operation in which the pattern 101 processed by photoexposure is subtracted from the pattern 102 processed by electron beam exposure, sets a flag, as the non-neighboring side, on the sides of the remaining pattern, other than the side abutting on the pattern 101 processed by photoexposure.

Here, the side that is not neighboring the shape pattern processed by photoexposure within the contour of the minus (−) differential pattern is a side neighboring to the design data 100 as viewed in FIG. 4B. Accordingly, the flag is set so that the side on which the plus (−) differential pattern is neighboring the pattern of the shape change target data, that is, the electron beam exposure data that have not been corrected, may be identified. The flag is also called the neighboring flag.

Figure 5:
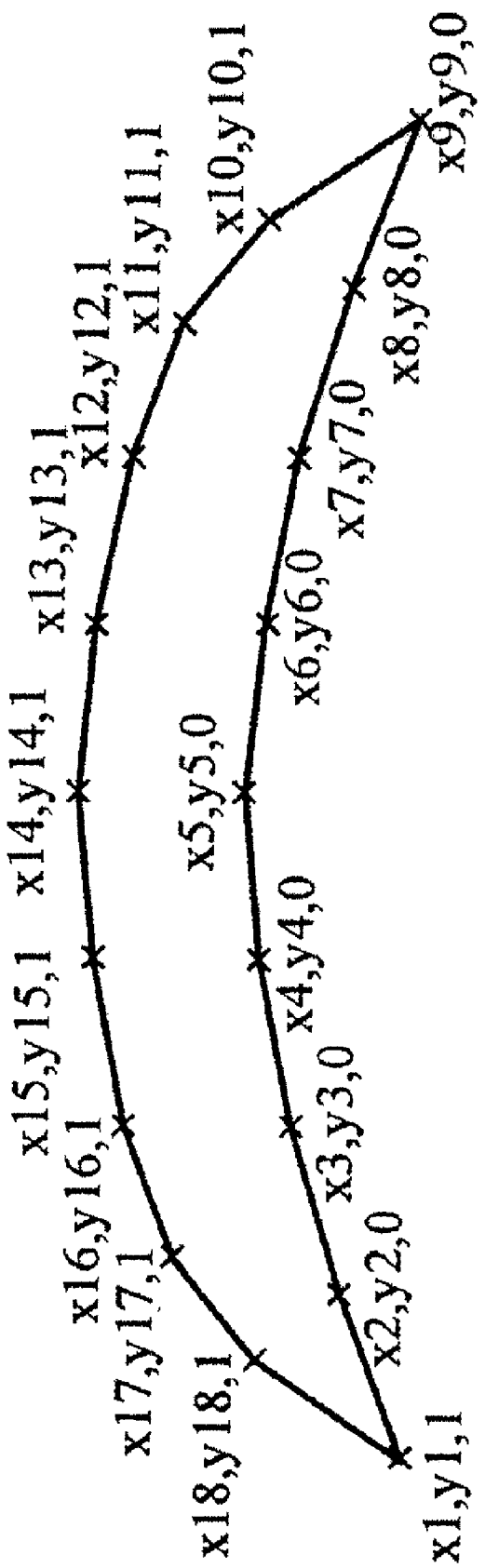
FIG. 5 is an example of a differential pattern.

FIG. 5 shows an example of the thus generated differential pattern. The differential pattern is presented by polygonal data defined by vertexes.

FIG. 6 shows a data structure of a differential pattern storage table for storing the differential pattern. The differential pattern storage table contains differential pattern management information and a table body. The differential pattern management information contains a differential flag and a vertex count. The differential flag is information that indicates which pattern, the plus (+) differential pattern or the minus (−) differential pattern. The vertex count is the number of vertexes of a polygon that forms the differential pattern. Further, the table body contains element information (X, Y, A) having a combination of vertex coordinates and a neighboring flag.

The data generation device sets an allowable value (comparison margin value) as to whether it is determined to be the differential, and determines only the portions that exceed the margin as the differential. The process using the margin in S6 corresponds to a suppression step. A value that represents a range in which a shape difference of the resist pattern falls within allowable process variations and a value that represents a range that does not influence a characteristic difference are externally specified as the comparison margin value. As a result of the comparison, if no differential is recognized, the electron beam exposure data that have been input to the electron beam exposure simulation are output as the final electron beam exposure data.

If the difference is recognized, the data generation device corrects the electron beam exposure data in accordance with the differential data (S10). The data generation device updates the electron beam exposure data with the corrected electron beam exposure data, and then sets the data as input data to the electron beam exposure simulation (see "overwriting" in FIG. 3, which corresponds to an updating step). These processes are repeated until the differential is eliminated. The foregoing control (in FIG. 6, the processes from the determination in S7 via S8 to S3) corresponds to a control step.

Figure 7:
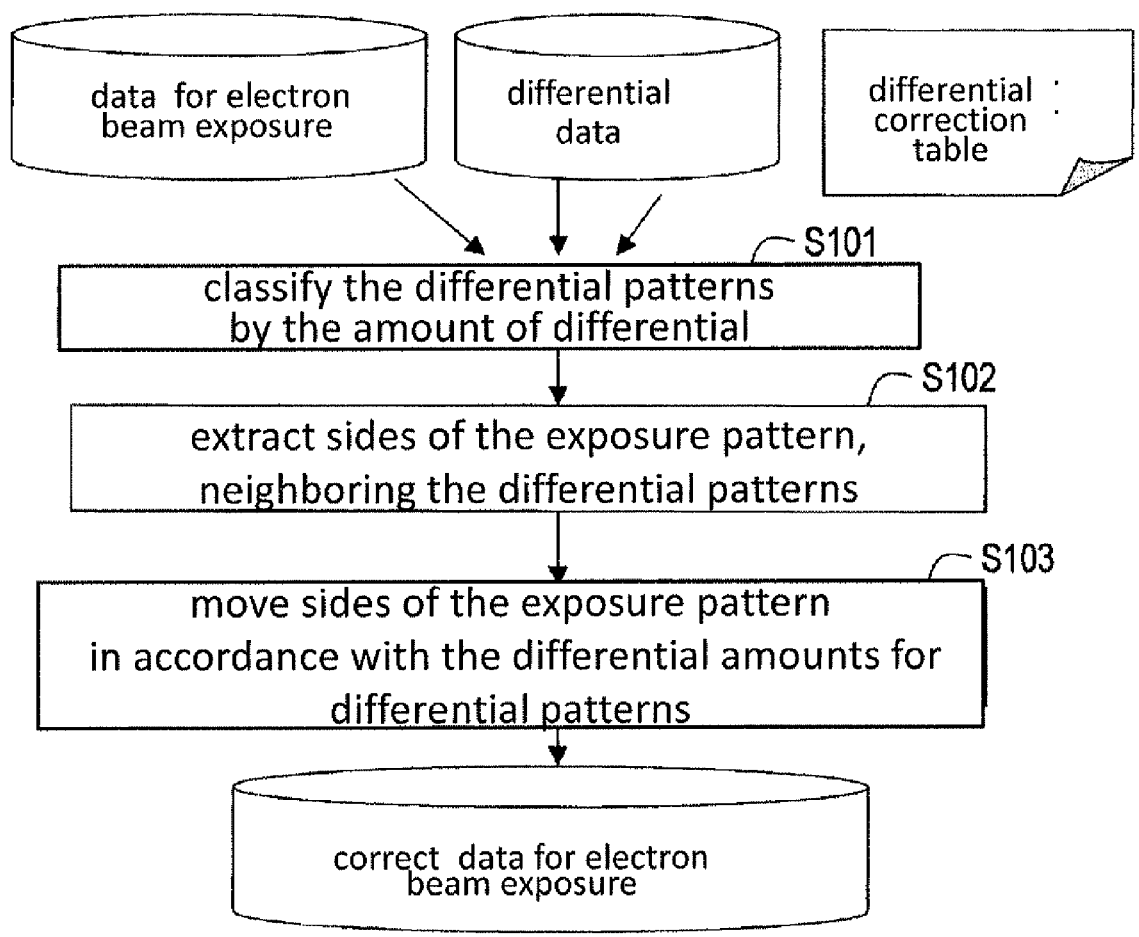
FIG. 7 is a flowchart that illustrates the details of an electron beam exposure data correction process.

A method of correcting the electron beam exposure data will be described with reference to FIG. 7 to FIG. 11. FIG. 7 is a flowchart that illustrates the details of an electron beam exposure data correction process (S10 in FIG. 3). FIGS. 8A-8D are views that illustrate changes in pattern resulting from the electron beam exposure data correction process.

Figure 8A:
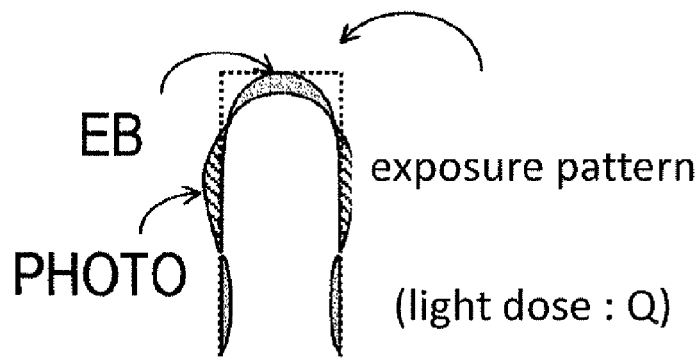
FIGS. 8A-8D are views that illustrate changes in pattern resulting from the electron beam exposure data correction process.

In the above process, the data generation device acquires the differential data and the differential correction table, and classifies the differential patterns by the amount of differential (S101). FIG. 8A shows an example of differential data. The curve indicated by EB is an example of a pattern processed by electron beam exposure. In addition, the curve indicated by PHOTO is an example of a pattern processed by photoexposure. The hatched portions are differential data portions between the pattern processed by electron beam exposure and the pattern processed by photoexposure. These pieces of differential data are held in the differential pattern storage table shown in FIG. 6.

Figure 8B:
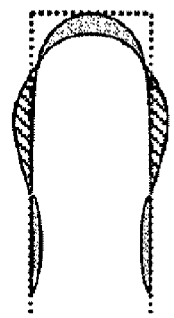

FIG. 9 shows a data example of the differential correction table. As shown in FIG. 9, each row of the differential correction table stores a pair of a differential amount d(k) (k=1, 2, . . . , n) and a side movement amount s(k) (k=1, 2, . . . , n). The differential amount is, for the plus (+) differential pattern, the width of the pattern and, for the minus (−) differential pattern, a value obtained by removing the sign of the width of the pattern. The kth row of the differential correction table holds a side movement amount s(k) with respect to a differential amount d that falls within the range of $d(k) \leq d < d(k+1)$ (k=1, . . . , n). Here, $d(k) \leq d < d(k+1)$ represents that, when d(n+1) is equal to an infinite distance, the differential amount d falls within the range of $d(k) \leq d < d(k+1)$ (k=1, . . . n). A portion of the differential data that the differential amount falls within the range of $d(k) \leq d < d(k+1)$ for each k are extracted, and the differential patterns are classified. FIG. 8B shows an example in which the differential data are classified in accordance with FIG. 9. Here, classified differential data portions are distinguished with different hatching types.

Note that the differential amount may be determined separately for each differential pattern (polygon illustrated in FIG. 5 and FIG. 6). In addition, it is also applicable that the polygon shown in FIG. 5 is further segmented into small patterns and then the differential amount is determined for each segmented portion. By segmenting the polygon into small patterns, it is possible to perform further detailed correction on the pattern.

Figure 8C:
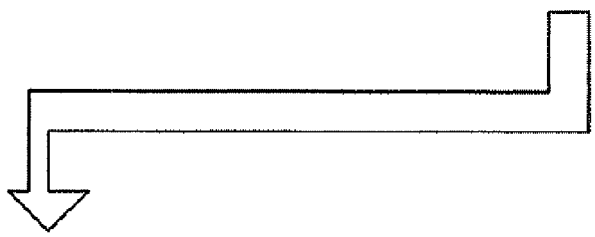

Next, the data generation device, for the classified differential patterns having respective differential amounts, extracts a (portion of) side of an exposure pattern neighboring the side to which the neighboring flag is set (S102). FIG. 8C shows an example of the extracted sides that are neighboring the differential patterns classified in accordance with the differential amounts. Here, the result of classifying the extracted sides are illustrated using line styles.

Figure 8D:
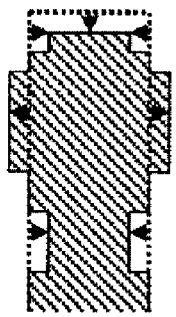

Furthermore, the data generation device determines movement amounts in accordance with corresponding side movement amounts in the differential correction table (which corresponds to a determination step), and the sides are moved (S103). FIG. 8D shows an example of a pattern after the sides have been moved. In this case, a side movement amount to a differential amount in the differential correction table is desirably set to half the differential amount or below. Each movement amount of a side is reduced and the shape is varied little by little from the original shape, so that it is possible to set the difference in resist pattern shape between electron beam exposure and photoexposure below an allowable value with a minimum variation from the original shape (or area).

Figure 10A:
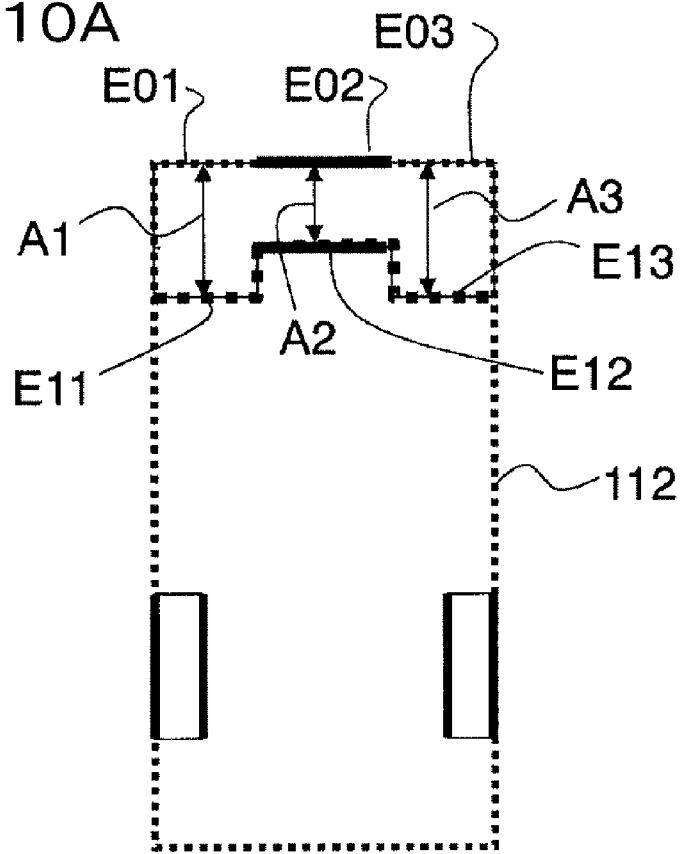
FIG. 10A is a view that illustrates the concept of a process performed on minus moving sides.

FIG. 10A to FIG. 10D are views that illustrate the concept of processes performed on moving sides of the pattern of electron beam patterning data. FIG. 10A is a view that schematically illustrates a process performed on minus moving sides. In FIG. 10A, a rectangle 112 is an example of one rectangle that, for example, constitutes the electron beam exposure data.

The data generation device searches a side that is closest to the side specified by the neighboring flag within the minus (−) differential pattern from among sides included in the rectangle 112 in the electron beam exposure data, and then sets the closest side to a correction target moving side. In the example of FIG. 10A, the top side of the rectangle 112 is searched as the moving side. Furthermore, the top side of the rectangle is classified into three portions, that is, E01, E02 and E03. This classification is according to the differential correction table. E11 to E13 are obtained by moving three portions E01, E02 and E03 of the side by movement amounts A1, A2 and A3 in accordance with the correction classification table. For a minus moving side, the pattern is moved in a direction to reduce the area.

Figure 10B:
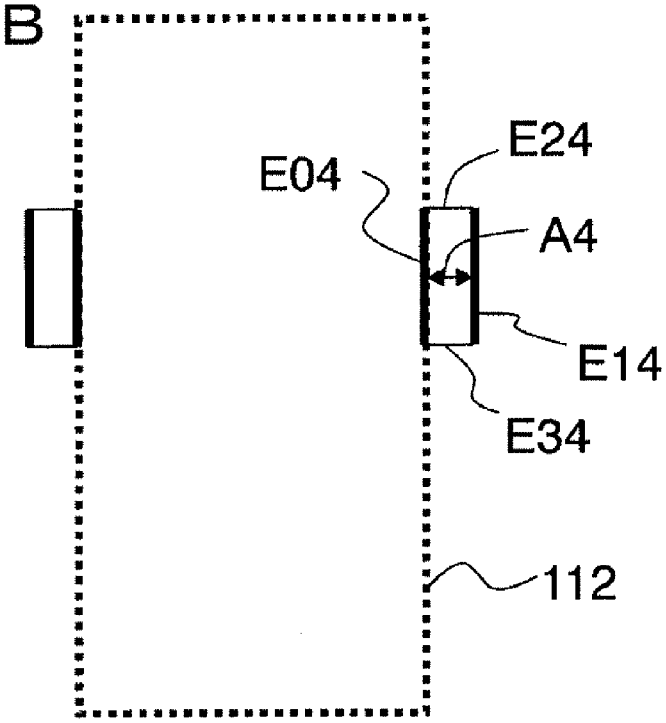
FIG. 10B is a view that illustrates the concept of a process performed on plus moving sides.

FIG. 10B is a view that schematically illustrates a process performed on plus moving sides. In this case as well, the data generation device searches a side that is closest to the side specified by the neighboring flag within the plus (+) differential pattern from among sides included in the rectangle 112 in the electron beam exposure data, and then sets the closest side to a correction target moving side. In the example of FIG. 10B, the right side of the rectangle 112 is searched as the moving side. Furthermore, within the right side of the rectangle 112, a movement amount A4 is specified to a portion E04. Then, the portion E04 of the right side of the rectangle 112 is moved in a direction in which the area of the pattern is increased by the movement amount A4, and a new side E14 is formed. Note that in accordance with the movement of the plus moving side, new sides E24 and E34 that correspond to the loci of both ends of the moving side are added.

Figure 10C:
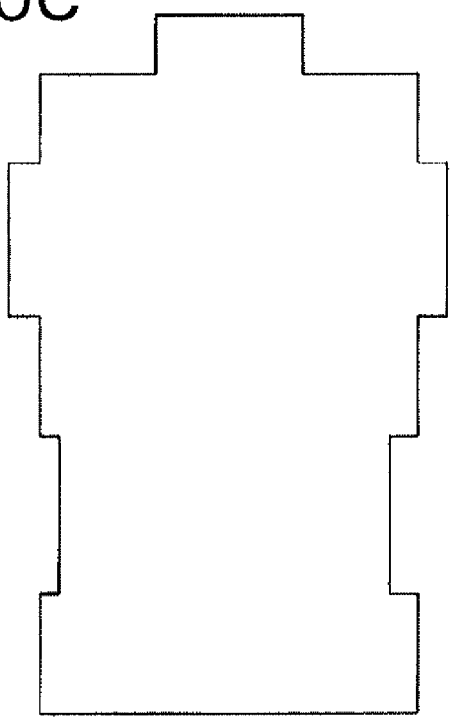
FIG. 10C is a view that illustrates the result of movement of the sides for the first time.

FIG. 10C is a view that illustrates the result of movement of the sides for the first time. The rectangle 112 shown in FIG. 10A and FIG. 10B varies into a pattern having a complex shape in accordance with movement of the sides. However, in the data generation device of the present embodiment, the movement amount of a side is set to a distance that is half the dimension of the differential pattern (which corresponds to a target shape variation) or below. Thus, it is highly likely that it is difficult to sufficiently approximate the pattern processed by electron beam exposure to the pattern processed by photoexposure through movement of the sides once. That is, it is highly likely that the differential is not eliminated by the correction of the electron beam exposure data (process of S10 in FIG. 11) once in the determination of S7 in the next loop. Then, the data generation device repeats the processes of S5 to S10 multiple times.

Figure 10D:
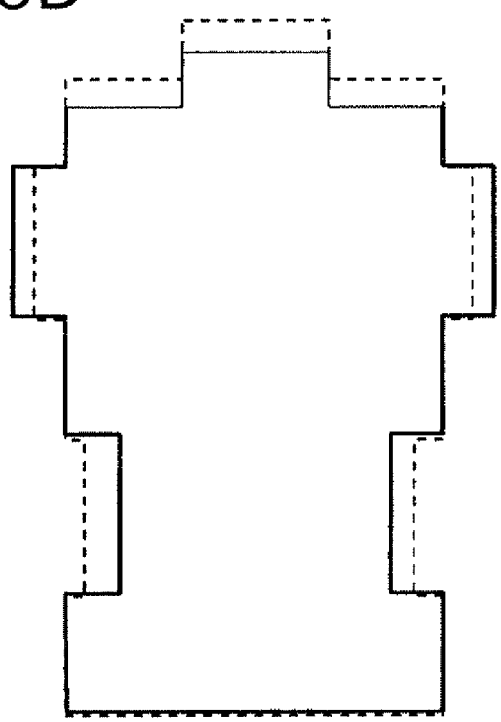
FIG. 10D is a view that illustrates the result of movement of the sides for the second time.

FIG. 10D is a view that illustrates the result of movement of the sides for the second time. In FIG. 10D, the solid line represents the result of movement of the sides for the second time. In addition, the dotted line represents the result of movement of the sides for the first time and has the same shape as that of FIG. 10C.

In this manner, when it is determined that there is no differential in the determination of S7 in the next loop, the correction of the electron beam exposure data will be complete. The thus corrected pattern is divided into rectangles again, and the respective rectangles are assigned with parameters that specify an exposure amount a dose, thus forming the changed portions of the electron beam exposure data.

As described above, according to the data generation device of the present embodiment, shape prediction data generated by a photoexposure simulator and shape prediction data generated by an electron beam exposure simulator are obtained and then the differential data between the two pieces of shape prediction data are generated. Then, in accordance with the differential correction table shown in FIG. 9, the dimension (amount of differential) of the differential data is classified and the movement amount of a side is obtained by classifications. At this time, the movement amount of a side is set to about half the dimension of the differential data or below. As a result, it is highly likely that it is difficult to sufficiently approximate the pattern processed by electron beam exposure to the pattern processed by photoexposure through the movement of the sides once. However, the movement amount is suppressed to half the estimated movement amount that is normally necessary, and then correction of the electron beam exposure data (S10) shown in FIG. 3 is repeatedly executed, so that it is possible to approximate the pattern processed by electron beam exposure to the pattern processed by photoexposure in fine steps. As a result, it is possible to suppress fluctuations in pattern area in accordance with movement of sides of the pattern of the electron beam exposure data. Thus, new electron beam exposure data need not be generated from the first in accordance with movement of sides of the pattern, and it is only necessary to correct the pattern with respect to the moved portions of the sides and then reflect the corrections in the electron beam exposure data. In this case, because fluctuations in area of the pattern are suppressed, it is not necessary to reset the dose (or parameter that identifies the dose) for the pattern of the electron beam exposure data. That is, it is possible to correct the electron beam exposure data by simply moving the sides of the pattern.

First Alternative Example

In the above first embodiment, over all portions of the design data, the wafer shape data 1A processed by photoexposure and the shape data 2A processed by electron beam exposure are compared, the differential data are extracted, and, if there is a differential, the electron beam exposure data are corrected. However, in place of the above process, the electron beam exposure data may be corrected only at portions that are presumably highly likely to influence the characteristics of the semiconductor device.

For example, it is applicable that the shape of a pattern that is included in a portion that is externally specified by the user is changed and then the corrected electron beam exposure data are generated. A correction target pattern that is selectively specified externally by the user is, for example, portions that influence the characteristics of the semiconductor device, such as a gate pattern that forms a transistor.

That is, the data generation device accepts specification of portions that influence the characteristics of the semiconductor device, such as a gate pattern that forms a transistor. Then, the data generation device extracts the pattern included in the specified portions separately from the other portions. Then, the data generation device generates data in which the pattern shape is corrected in the same manner as described above for the extracted partial pattern. Then, the data generation device replaces portion of the pattern corresponding to the specified portion with the corrected pattern. Then, the data generation device performs the replacement without varying the correction dose of that pattern portion, thus generating the final electron beam exposure data. In this manner, the data generation device partially corrects the electron beam exposure data generated by performing various types of correction process, including a dose correction process, necessary for electron beam exposure to the wafer.

FIG. 11 is a view that illustrates the process flow in which the electron beam exposure data are corrected with a limited correction target. In FIG. 11, as compared with the process shown in FIG. 3, the correction target specification table 5 is referred to in the process S4 and process S5. The correction target specification table 5 holds correction target information. Portion of exposure data on which the processes S4 to S10 should be executed are specified in the correction target information.

Figure 12:
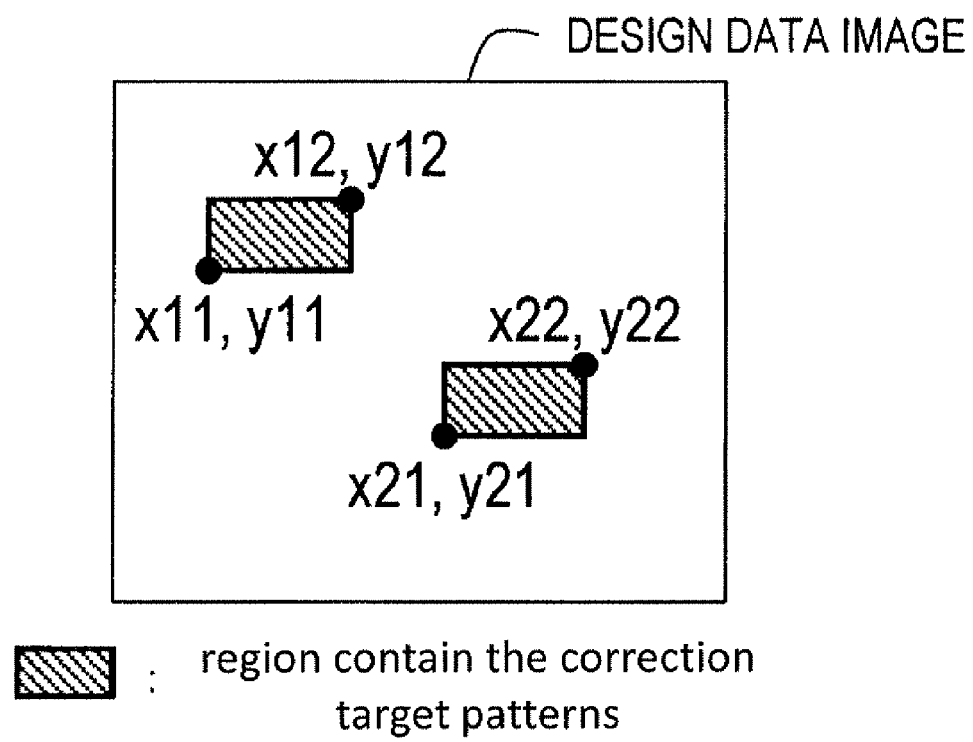
FIG. 12 is an example of correction target information.

FIG. 12 is an example of the correction target information. In the example, the correction target information is information that defines rectangular areas. A rectangular area is, for example, defined by the bottom left point and top right point of the rectangle, like (x1, y1) (x2, y2). Multiple rectangular areas may be specified. A rectangular area may contain a plurality of figures defined by a closed loop, or may contain portion of a figure defined by a closed loop. A group of figures within the same rectangular area is regarded as one pattern, and the processes of S4 to S10 shown in FIG. 3 are executed thereon.

FIG. 13 is an example of data of the correction target specification table 5. The correction target specification table specifies a rectangular area with a bottom left X coordinate, a bottom left Y coordinate, a top right X coordinate, and a top right Y coordinate for each area. These coordinates may be, for example, specified with a coordinate system having the same origin as the chip.

The data generation device extracts the electron beam exposure data of the correction target portions on the basis of the correction target information set by the user. The above process may be, for example, performed by executing AND operation between the above described rectangular areas and the electron beam exposure data. Then, it is only necessary that on the basis of the correction target information, the processes of S4 to S10 are executed on limited portions extracted from the electron beam exposure data. As a result, it is possible to limit generation of differential data and a correction target pattern based on the differential data to a specific portion. Here, the correction target information is configured to define a rectangular area; instead, it may be configured to define a polygonal area.

As described in Japanese Laid-open Patent Publication No. 2003-151885, exposure data is generally corrected through simulation. However, in order to correct only the portion of the pattern after the dose correction process, restriction, which is not provided for the existing method, is imposed. That is, it is necessary to reduce a variation in distribution of dose before and after correction as much as possible. As a distribution in dose varies, the influence of back scattering in which an electron beam that enters the resist is reflected on the substrate and spreads to within the range of a radius of several tens of micrometers varies. As a result, resultant dimensions of the surrounding patterns vary. This requires a correction on the surrounding patterns as well, and increases data processing time.

Then, in the data generation device, the correction dose that is set in the dose correction process is substantially fixed and only the shape is changed. A target shape is originally the same between electron beam exposure and photoexposure, so that even when the shape of electron beam exposure pattern is changed so as to conform to the resultant shape processed by photoexposure, the area of the pattern does not fluctuate largely. However, by changing the shape so as to reduce the fluctuation in the area as small as possible, it is possible to reduce the side effect on the surroundings.

Second Alternative Example

In the above embodiment, exposure simulation is used to obtain the shape of a resist pattern; instead, the electron beam exposure data may be corrected on the basis of an actually formed pattern. For example, differential data may be obtained by extracting the contours from a scanning electron microscope (SEM) image of a pattern on the semiconductor substrate.

Second Embodiment

In the first embodiment, in the series of processes following the process of generating the electron beam exposure data (S3 in FIG. 11), the electron beam exposure data are corrected. In place of the above processes, separately from generation of the electron beam exposure data, correction of a pattern may be executed with respect to a correction target portion. Then, the final electron beam exposure data may be generated in such a manner that the pattern of portion of the electron beam exposure data generated without correction of the pattern in accordance with the normal procedure is replaced with portion of the obtained electron beam exposure pattern after correction. That is, at a timing (so to speak, in an off-line state) different from generation of the electron beam exposure data, the pattern corrected in the same manner as the first embodiment with respect to only a correction portion may be generated and the replacement process may be executed.

Figure 14:
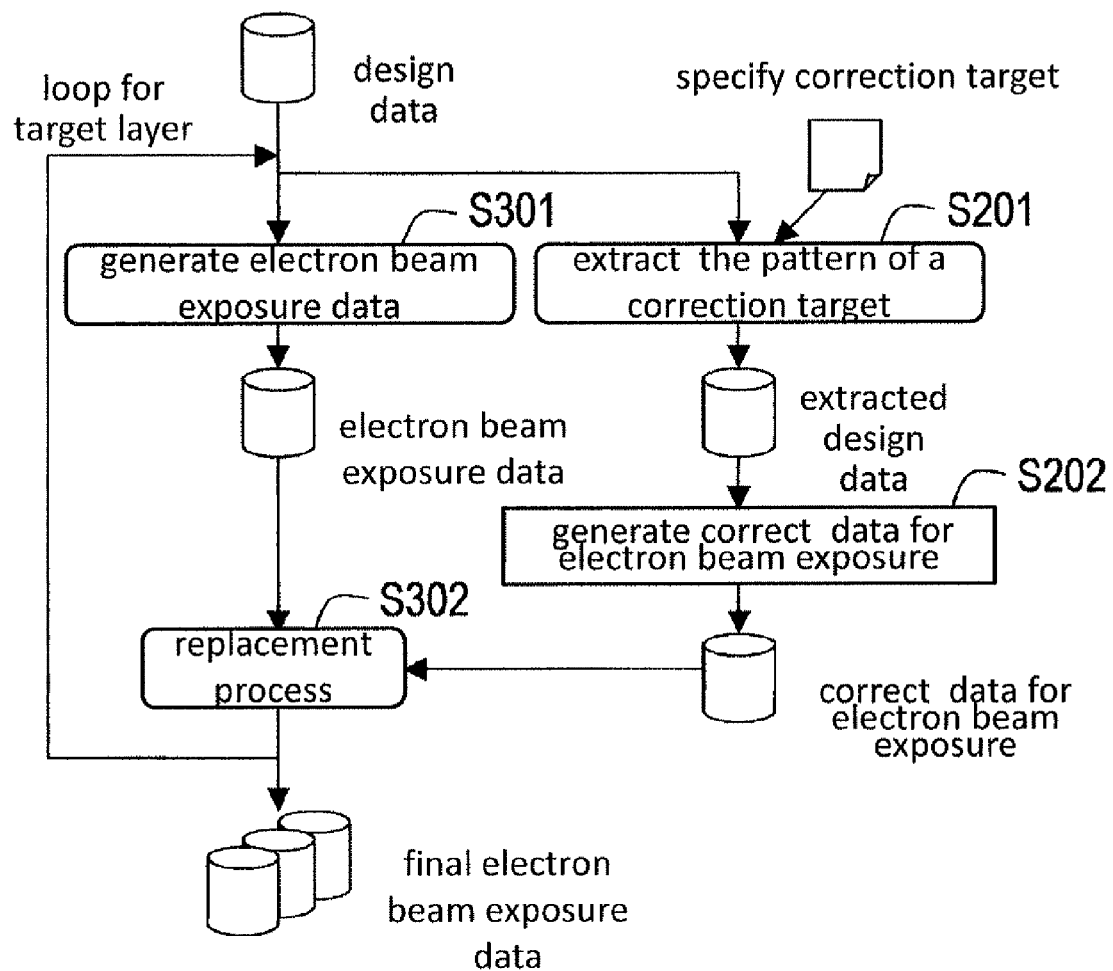
FIG. 14 is a view that illustrates the flow of an electron beam exposure data generation process according to a second embodiment.

FIG. 14 is a view that illustrates the flow of an electron beam exposure data generation process according to the second embodiment. Here, the data generation device extracts the pattern of a correction target specification portion, which is externally specified by the user, from the design data of an exposure target layer of the semiconductor device (S201). Here, a method of specifying a correction target pattern may be configured to specify a rectangular area that includes the correction target pattern shown in the first embodiment. In that case, it is only necessary that AND operation is performed between the rectangular area and the design data. In addition, other than specifying the rectangular area, a hierarchy that includes a correction target pattern may be specified from among hierarchies in the design data. In that case, only the hierarchy (for example, hierarchy that specifies a gate) of the design data may be selected, and the pattern data may be extracted.

Then, the data generation device generates electron beam exposure correction data in which the pattern is corrected so that a resultant shape of the resist pattern when exposure is performed by electron beam is approximate to that of photoexposure (S202). To generate the electron beam exposure correction data, it is only necessary that the same process as the process flow of FIG. 11 shown in the first embodiment is executed. In this way, corrected electron beam exposure data are generated once with respect to only the correction target portion. Note that on the electron beam exposure data, a dummy pattern generation for planarization is performed on the design data in an exposure layer that requires the dummy pattern generation, and besides, data processing necessary for wafer exposure, such as a microloading effect correction for considering the influence of etching, a proximity correction (including dose correction), or a stitching correction, is performed.

On the other hand, in the process of FIG. 14, the data generation device generates electron beam exposure data by inputting the design data through a normal procedure (S301). In the generation of electron beam exposure data, the same process (S3) as generation of electron beam exposure data performed in the process flow in FIG. 3 or FIG. 11 is performed. Furthermore, a dummy pattern generation for planarization is performed on the design data in an exposure layer that requires the dummy pattern generation, and besides, data processing necessary for wafer exposure, such as a microloading effect correction for considering the influence of etching, a proximity correction (including dose correction), or a stitching correction, is performed.

Finally, the correction target pattern of the electron beam exposure data is replaced with the pattern corresponding to the electron beam exposure correction data (S302). There is no difference in correction dose between the patterns, so that it is extremely less likely that a side effect occurs on the surrounding patterns.

Computer Readable Recording Medium

A program that implements any one of the above described functions on a computer, other machines, devices (hereinafter, referred to as computer and the like) may be recorded on a recording medium that is readable by the computer and the like. Then, the computer and the like reads the program on the recording medium to execute the program, thus making it possible to provide the function of the program.

Here, the recording medium readable by the computer and the like is a recording medium capable of storing information, such as data or programs, electrically, magnetically, optically, mechanically or by chemical action, which can be read through the computer and the like. Among these recording media, for example, a flexible disk, a magneto-optical disk, a CD-ROM, a CD-R/W, a DVD, a DAT, an 8 mm tape, a memory card, and the like, are removable from the computer and the like.

Further, a hard disk, a ROM (Read-Only Memory), and the like, are recording media fixed within the computer and the like.

All examples and conditional language recited herein are intended for pedagogical purposes to aid the reader in understanding the invention and the concept contributed by the inventor to furthering the art, and are to be construed as being without limitation to such specifically recited examples and conditions, nor does the organization of such examples in the specification related to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method for performing electron beam exposure by an electron beam exposure apparatus comprising:

correcting a dose of electron beam exposure using design data of a semiconductor device;

generating electron beam exposure data, used for electron beam exposure, and photoexposure data, used for photoexposure, from the design data of a semiconductor device;

extracting differential information that indicates a differential portion between a shape of an electron beam exposure pattern formed on a substrate through electron beam exposure on a basis of the electron beam exposure data and a shape of a photoexposure pattern formed on the substrate through photoexposure on a basis of the photoexposure data of the semiconductor device;

determining whether a size of the differential portion between the shape of the electron beam exposure pattern and the shape of the photoexposure pattern falls within a reference value;

acquiring shape changed exposure data in accordance with the difference information between the shape of the photoexposure pattern and an exchanged shape of an electron beam exposure pattern that is changed in accordance with the photoexposure pattern while the dose of electron beam exposure is fixed, and updating by overwriting the electron beam exposure data with the shape changed exposure data if the size of the differential portion does not fall within the reference value;

repeating the extracting differential information, the determining and the acquiring shape changed exposure data when the size of the differential portion falls outside the predetermined reference value; and performing electron beam exposure, using the updated electron beam exposure data, by the electron beam exposure apparatus.

2. The method for performing electron beam exposure by an electron by an electron beam exposure apparatus according to claim 1, wherein the updating step further includes: classifying the size of the difference between the shapes into multiple stages; and determining a shape variation by which the pattern of the electron beam exposure data, corresponding to the difference, is changed in shape in each of the stages.

3. The method for performing electron beam exposure by an electron exposure apparatus according to claim 2, wherein the shape variation is specified as a value that is smaller than a target shape variation necessary to eliminate the difference through execution of the updating step once.

4. The method for performing electron beam exposure by an electron beam exposure apparatus according to claim 1, wherein the generating photoexposure data for photoexposure, includes:

generating photoexposure data, used for simulating photoexposure, from the design data; and generating, from the photoexposure data, a shape that simulates the photoexposure pattern.

5. The method for performing electron beam exposure by an electron beam exposure apparatus according to claim 1, wherein the generating electron beam exposure data, includes:

generating electron beam exposure data, used for simulating electron beam exposure, from the design data; and generating, from the electron beam exposure data, a shape that simulates the electron beam exposure pattern.

6. The method for performing electron beam exposure by an electron beam exposure apparatus according to claim 1, wherein in the extracting differential information extraction of the differential information is suppressed when the size of the differential portion is smaller than a predetermined allowable value.

7. The method for performing electron beam exposure by an electron beam exposure apparatus according to claim 1:
   wherein the generating photoexposure data for photoexposure, includes:
      generating photoexposure data, used for creating a mask for simulation of photoexposure or a mask for photoexposure, from the design data, and
      executing a correction process that includes at least one of a dummy pattern generation for planarization, an optical proximity correction, a local flare correction, or a microloading effect correction for etching, and
   wherein the generating electron beam exposure data includes executing a correction process that includes at least one of a dummy pattern generation for planarization, a proximity correction, a stitching correction, or a microloading effect correction for etching.

8. An electron beam exposure system comprising:
   a data generation device that includes: a correcting unit that corrects a dose of electron beam exposure using design data of a semiconductor device; an electron beam exposure data generation unit that generates electron beam exposure data, used for electron beam exposure, from the design data of a semiconductor device and a photoexposure data generation unit that generates photoexposure data, used for photoexposure, from the design data of a semiconductor device;
   a photoexposure pattern storage unit that stores the shape of a photoexposure pattern formed on a substrate through photoexposure on a basis of the photoexposure data;
   an electron beam exposure pattern storage unit that stores the shape of an electron beam exposure pattern formed on the substrate through electron beam exposure on the basis of the electron beam exposure data;
   a differential extraction unit that extracts differential information that indicates a difference between the shape of the photoexposure pattern and the shape of the electron beam exposure pattern;
   a determination unit that determines whether the size of the difference between the shape of the electron beam exposure pattern and a shape of the photoexposure pattern falls within a predetermined reference value;
   an updating unit that acquires shape changed exposure data n accordance with the difference information between the shape of the photoexposure pattern and an exchanged shape of an electron beam exposure pattern that is changed in accordance with the photoexposure pattern while the dose of electron beam exposure is fixed, and updating by overwriting the electron beam exposure data with the shape changed exposure data if the size of the differential portion does not fall within the reference value; and
   a control unit that repeatedly starts the differential extraction unit, the determination unit, and the updating unit when the size of the difference is outside the predetermined reference value; and
   an exposure apparatus that creates a pattern on a semiconductor substrate in accordance with the electron beam exposure data generated by the data generation device.

* * * * *

UNITED STATES PATENT AND TRADEMARK OFFICE
CERTIFICATE OF CORRECTION

PATENT NO. : 8,429,573 B2
APPLICATION NO. : 12/350525
DATED : April 23, 2013
INVENTOR(S) : Kozo Ogino et al.

It is certified that error appears in the above-identified patent and that said Letters Patent is hereby corrected as shown below:

In the Claims:

Column 18, Line 35, In Claim 2, after "exposure by electron" delete "by an electron".

Column 18, Line 42, In Claim 3, after "electron" insert -- beam --.

Column 20, Line 14, In Claim 8, delete "n" and insert -- in --, therefor.

Signed and Sealed this
Sixth Day of August, 2013

Teresa Stanek Rea
*Acting Director of the United States Patent and Trademark Office*